United States Patent [19]
McClure

[11] Patent Number: 5,666,482
[45] Date of Patent: Sep. 9, 1997

[54] METHOD AND SYSTEM FOR BYPASSING A FAULTY LINE OF DATA OR ITS ASSOCIATED TAG OF A SET ASSOCIATIVE CACHE MEMORY

[75] Inventor: David Charles McClure, Carrollton, Tex.

[73] Assignee: SGS-Thomson Microelectronics, Inc., Carrollton, Tex.

[21] Appl. No.: 719,734

[22] Filed: Sep. 25, 1996

Related U.S. Application Data

[63] Continuation of Ser. No. 533,358, Sep. 25, 1995, abandoned, which is a continuation of Ser. No. 221,072, Mar. 31, 1994, abandoned.

[51] Int. Cl.⁶ .................. G06F 12/08; G06F 11/00
[52] U.S. Cl. .................. 395/182.06; 711/129; 711/138; 711/154; 711/160
[58] Field of Search .................. 395/182.06, 182.05, 395/182.04, 465, 455, 456, 445, 460, 481, 471, 472; 371/21.6

[56] References Cited

U.S. PATENT DOCUMENTS

| | | | |
|---|---|---|---|
| 3,768,071 | 10/1973 | Knauft et al. | 371/13 |
| 4,168,541 | 9/1979 | DeKarske | 371/13 |
| 4,506,364 | 3/1985 | Aichelmann, Jr. et al. | 371/13 |
| 4,608,687 | 8/1986 | Dutton | 371/13 |
| 4,633,429 | 12/1986 | Lewandowski et al. | 365/96 |
| 4,791,642 | 12/1988 | Taylor et al. | 371/13 |
| 4,800,563 | 1/1989 | Itugaki et al. | 371/13 |
| 4,833,601 | 5/1989 | Barlow et al. | 371/13 |
| 5,070,502 | 12/1991 | Supnik | 371/11.1 |
| 5,551,004 | 8/1996 | McClure | 395/465 |

FOREIGN PATENT DOCUMENTS

| | | | |
|---|---|---|---|
| A-0009412 | 4/1980 | European Pat. Off. | G11C 9/06 |
| A-114 763 | 8/1984 | European Pat. Off. | G06F 11/20 |
| A-0173556 | 3/1986 | European Pat. Off. | G06F 12/12 |
| A-0287334 | 10/1988 | European Pat. Off. | G06F 12/08 |
| A-2635607 | 2/1990 | France | G11C 29/00 |

OTHER PUBLICATIONS

Fault-Tolerant Architecture in a Cache Memory Control LSI, Yasushi Ooi et al, 8107 IEEE Journal of Solid State Circuits, 27(1992) Apr., No. 4, New York, US.

Primary Examiner—Robert W. Beausoliel, Jr.
Assistant Examiner—Joseph E. Palys
Attorney, Agent, or Firm—Theodore E. Galanthay; Lisa K. Jorgenson; Renee M. Larson

[57] ABSTRACT

According to the present invention, faulty lines of data of a set associative cache memory containing one or more faulty data bits which are not repairable through conventional repair means such as row/column redundancy, are not updated following a cache miss condition and thereby effectively bypassed. Replacement logic circuitry detects and controls the state of a replacement status bit associated with each line of data of the set associative cache memory to determine if the line of data in the cache should be updated or bypassed. Thus, when replacing a line of data, the replacement logic circuitry detects the address of a faulty line of data in a particular set and avoids updating that faulty line of data in favor of updating another line of data of another set. The replacement logic circuitry may be used with a variety of replacement algorithms including the least recently used (LRU) replacement algorithm, the first in first out (FIFO) replacement algorithm, the last in first out (LIFO) replacement algorithm, the random replacement algorithm, or the pseudo LRU replacement algorithm.

31 Claims, 2 Drawing Sheets

, 666,482

METHOD AND SYSTEM FOR BYPASSING A FAULTY LINE OF DATA OR ITS ASSOCIATED TAG OF A SET ASSOCIATIVE CACHE MEMORY

This is a continuation of application Ser. No. 08/533,358, filed Sep. 25, 1995, now abandoned, which is a continuation of application Ser. No. 08/221,072, filed Mar. 31, 1994, now abandoned.

CROSS REFERENCE TO RELATED APPLICATIONS

The subject matter of the present application is related to copending U.S. application, Ser. No. 08/146,228, titled "Structure to Utilize a Partially Functional Cache Memory by Invalidation of Faulty Cache Memory Locations", Docket No.: 93-C-59, filed Nov. 1, 1993, assigned to the assignee hereof, which is herein incorporated by reference.

BACKGROUND OF THE INVENTION

The present invention relates generally to integrated circuit memories, and more specifically to set associative cache memories.

During the manufacture of integrated circuit memory devices, die are often discarded when certain bits of the die are defective but not easily identified and repaired. Even though a majority of the die may be fully functional, it is often necessary to discard the entire die if the faulty bits of the die are not repairable. This problem is exacerbated when a memory device is embedded in another, more expensive device such as a microprocessor or an application specific integrated circuit (ASIC). For example, it is undesirable to discard a costly microprocessor because the memory embedded within it has faulty bits. Memories which may have faulty bits include cache memories, memory cards, and memories embedded in ASICs.

Cache memories are important elements of the typical cache system and are increasingly used as primary caches embedded in high performance microprocessors or as secondary caches external to the microprocessor. As microprocessors have achieved faster operating speed, the rate at which requested data must be supplied to them has correspondingly increased. Cache memories typically have faster access times than main memory and thus are often used to quickly supply data requested by the microprocessor. The tag associated with a "line" of data, a block of data which can be one or several consecutive bytes or words of data, in the cache memory is stored in a tag RAM which holds the address locations of data stored in the data cache. In addition to address information, one or more status bits, often including a valid bit which indicates whether data stored at a particular address location is valid or invalid, is stored in the tag RAM. When the microprocessor requests information, a read signal is sent to both the main memory and the tag RAM. The tag RAM compares the requested memory address with the memory address of all data stored in the cache memory. If the requested memory address is in the tag RAM, a "hit" condition exists, and data from that location will be gated from the cache memory to the microprocessor.

In a "hit" condition, the tag RAM generates a valid compare Match output signal and the cache memory gates the required data onto the data bus before the main memory can respond. In this way, the cache memory quickly supplies data to the microprocessor and microprocessor wait states are avoided. However, if the tag RAM's comparison operation indicates that the desired data is not stored inside the cache memory, a "miss" condition exists, and the data must come from main memory which typically holds more data than the cache memory and is therefore much slower. As a result, the microprocessor may have to wait for several cycles, during which time it is idle, before receiving requested data from main memory. These unproductive cycles are referred to as "wait states" since the microprocessor must wait until the requested data is provided from main memory.

In place of the direct-mapped cache memory described above, set-associative cache memories are often used because of the performance enhancement they can provide. In a set-associative cache memory, there are two or more "sets" from which data may be supplied to the microprocessor. Thus, if one set does not contain the requested data, another set may very well be able to provide valid data. In a two-way set-associative cache system, for example, the cache is split into two smaller, somewhat independent caches. This allows for two tags to be stored for a given index address and the two associated lines of data in each cache memory; the index of the tag is the least significant bits (LSBs) of the address field, used to address a given tag location, and the tag bits are the most significant bits (MSBs). Set-associative cache systems typically possess higher hit rates than a comparable direct mapped cache, although there is added complexity embodied in replacement algorithms which determine what cache location of which tag RAM to overwrite upon a miss condition.

FIG. 1 shows a block diagram of a set-associative cache system 10 which is comprised of five main elements: microprocessor 12, main memory 13, tag RAM A 14, tag RAM B 16, cache memory set A 18, cache memory set B 19, and control logic 20. Because the cache memory is separate from the microprocessor, cache system 10 is a secondary cache system which is shown for clarity. In a primary cache system, cache memory set A 18 and set B 19 would be embedded in the microprocessor, and thus is sometimes called an embedded cache memory. Microprocessor 12 could obtain all needed data from the slow main memory 13. However, since main memory 13 is typically much slower than microprocessor 12, microprocessor 12 will incur "wait states" until the data arrives from main memory 13. During wait states, microprocessor 12 is idle. Wait states have a negative impact on the efficiency of the microprocessor.

For these reasons, a cache system is used to provide the microprocessor with data in a more timely fashion, in the hopes of reducing or even eliminating microprocessor wait states. The secondary cache system, composed of tag RAM A 14, tag RAM B 16, cache memory set A 18, cache memory set B 19, and control logic 20, resides between microprocessor 12 and main memory 13. Set A 18 and set B 19 together comprise a two-way set associative cache memory and each store a copy of frequently accessed main memory data. Storing data commonly accessed by the microprocessor 12 increases the likelihood that cache memory set A 18 or set B 19 will have the requested data in the event of a microprocessor memory cycle.

Transparent to main memory 13, either cache memory set A 18 or cache memory set B 19 will supply data to microprocessor 12 upon a microprocessor read cycle if they have the requested data. Tag RAM A 14 determines if cache memory set A 18 has the data requested by the microprocessor 12 while tag RAM B 16 determines if cache memory set B 19 has the requested data; Tag RAM A 14 stores the memory addresses and status bit information of data stored in cache memory set A 18 and tag RAM B 16 stores the memory addresses and status bit information of data stored in cache memory set B 19. Valid bit 17 is a status bit which indicates whether the data stored at a particular address location is valid or invalid. The valid bits of address locations stored in tag RAM A 14 and tag RAM B 16 are typically cleared by resetting the value of the valid bit for all address locations in the tag RAM through software or hardware means at the start of a new process or program. Valid bit 17 is tied to a logic high voltage level, $V_{CC}$, as shown in FIG. 1, such that subsequent write cycles from microprocessor 12 write a "one" to newly written tag RAM address locations. Until microprocessor 12 writes data to a cache memory location, the valid bit 17 for that address location will be invalid or equal to a logic low level.

Upon a microprocessor read, the tag RAM A 14 and tag RAM B 16 compare the address of the data being sought with the addresses of data stored in the cache memory set A 18 and cache memory set B 19, respectively. If a "hit" or match condition exists in either set A 18 or set B 19 and the valid bit 17 as well as other status bits for that address index location are valid, the appropriate tag RAM A 14 or tag RAM B 16 generates a logic high Match output signal 15 which indicates that its cache memory set A 18 or set B 19 has the desired data. Control logic 20 determines which set will provide the data as a function of the match and status bits, and data from the appropriate set of the cache memory is then gated onto the data bus where it is received by microprocessor 12. If, however, tag RAM A 14 or tag RAM B 16 determines the desired data address does not match any addresses stored in the cache memory set A 18 or cache memory set B 19, respectively, a "miss" condition for that set exists. Or, if the desired data address matches an address stored in cache memory set A 18 or cache memory set B 19 but valid bit 17 for that address is invalid, a "miss" condition also exists. In response to a "miss" condition, the tag RAM generates a logic low Match output signal.

Once it has been determined that cache memory set A 18 or cache memory set B 19 contains the data of the memory address being requested and that the data is valid, the associated tag RAM generates Match output signal 15. Match output signal 15 functions as a high-speed chip select which allows or does not allow data from the cache memory to be gated onto the data bus to the microprocessor. If the tag RAM comparison function indicates a "hit" condition then the cache memory outputs are simply enabled. If a "miss" condition is indicated, the outputs of the appropriate cache memory set are not enabled and main memory 13 will ultimately supply the data to the microprocessor 12. When a "miss" occurs, replacement algorithms, such as the least recently used (LRU), the first in first out (FIFO), the last in first out (LIFO), the random replacement algorithm, and the pseudo LRU replacement algorithm are used to determine whether a replacement line of data from main memory will be used to update set A 18 or set B 19. This parallel activity during cache memory read cycles saves time and can possibly allow the data to be read by microprocessor 12 in a single cycle, with no wait states.

A set associative cache memory where one or more sets have randomly occurring bit(s) failures is often discarded. Unfortunately, set associative cache memories may suffer from bit failures due to randomly occurring process problems such as single bit failures, particle contamination, locked rows, locked columns, and metal or polysilicon shorts. These failures may not be easily repaired, especially if no row or column redundancy testing is employed. Even when redundancy testing at laser repair is used, this technique may not be sufficient to ferret out all bit failures. Therefore, when a set associative cache memory having bit(s) failures is resident in microprocessors, ASICs, or other devices, both the faulty cache memory and the expensive fully functional device in which it is embedded are often discarded. Thus, there is a current unmet need in the art to compensate for random bit(s) failures such that set associative cache memories having faulty data bits are rendered usable. It would be desirable to bypass defective data locations in the set associative cache memory such that the cache memory and any device in which it is embedded need not be scrapped.

SUMMARY OF THE INVENTION

It would be advantageous in the art to bypass lines of data which contain one or more faulty bits of data in a set associative cache memory so as to render the set associative cache memory usable.

Therefore, according to the present invention, faulty lines of data of a set associative cache memory containing one or more faulty data bits which are not repairable through conventional repair means such as row/column redundancy, are not updated following a cache miss condition and thereby effectively bypassed. Replacement logic circuitry detects and controls the state of a replacement status bit associated with each line of data of the set associative cache memory to determine if the line of data in the cache should be updated or bypassed. Thus, when replacing a line of data, the replacement logic circuitry detects the address of a faulty line of data in a particular set and avoids updating that faulty line of data in favor of updating another line of data of another set. The replacement logic circuitry may be used with a variety of replacement algorithms including the least recently used (LRU) replacement algorithm, the first in first out (FIFO) replacement algorithm, the last in first out (LIFO) replacement algorithm, the random replacement algorithm, or the pseudo LRU replacement algorithm.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DESCRIPTION OF THE INVENTION

Figure 1:
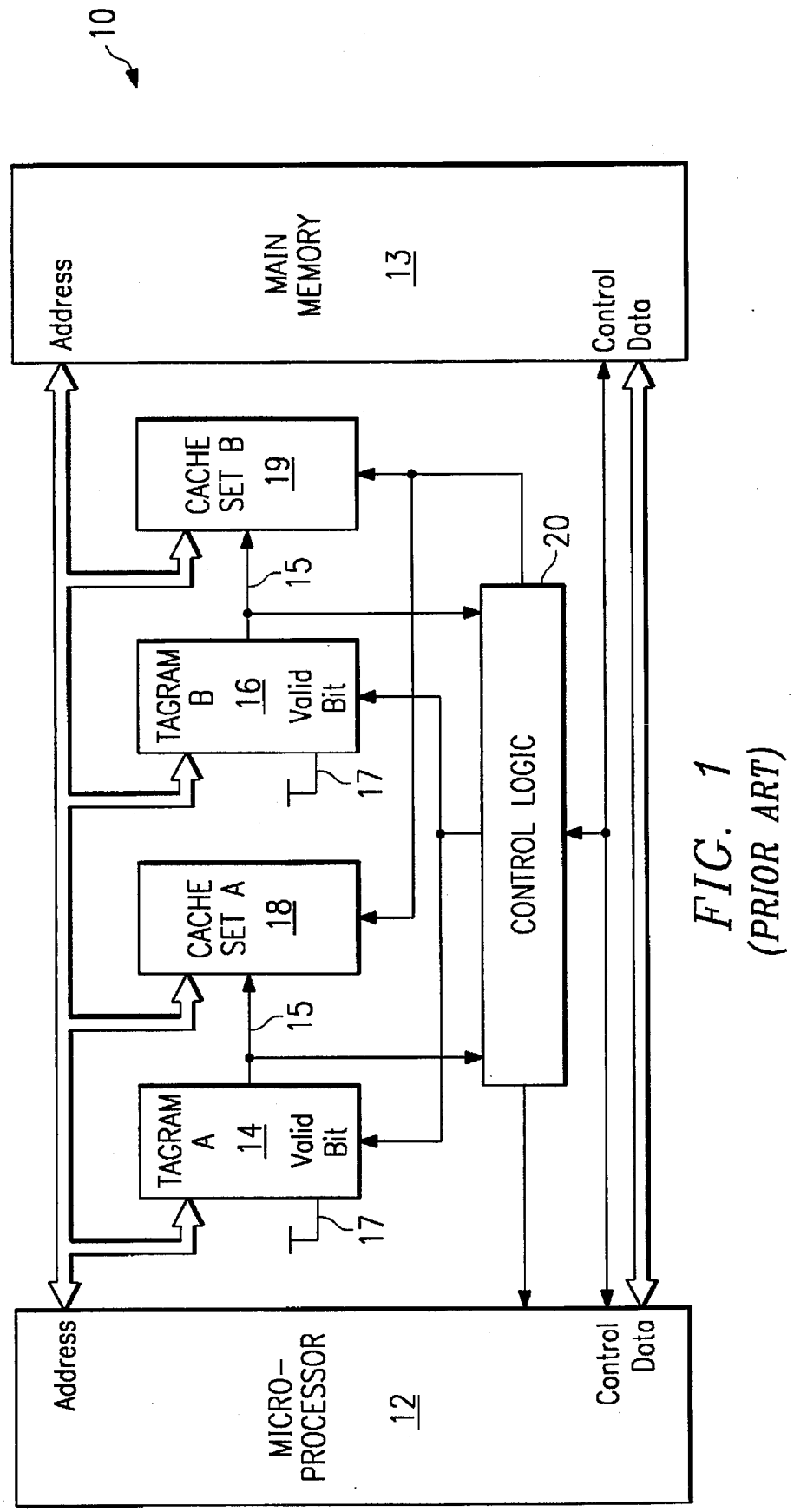
FIG. 1 is a block diagram of a set-associative cache memory system.

Set-associative cache memories are attractive because of the higher hit rate and performance advantages they offer over conventional direct-mapped cache memories. Because set associative cache memories are comprised of two or more sets of data, the control circuitry that determines which set to update following a cache miss condition is complex. In order to keep track of which set of data to update following a cache miss condition, replacement logic algorithms such as the Least Recently Used (LRU), the First In First Out (FIFO), the Last In First Out (LIFO), the random replacement algorithm, and the pseudo LRU replacement algorithm are typically used.

The present invention utilizes replacement logic circuitry that controls the set selection of a set associative cache memory in order to ensure that faulty lines of data of a set are not updated and effectively bypassed following a cache miss condition; a bad line of data within a set is not selected to be updated. A faulty line of data is defined as a line of data which contains one or more faulty bits of data. The faulty bits of data exist in the set associative cache memory in the data cache (or its associated tag), which stores various lines of data. Updating refers to writing to a particular location of the set associative cache memory with a new line of data. Individual faulty data locations of a set are communicated to the replacement logic circuitry so that during set selection of the set associative cache memory, a set containing a faulty line of data for a particular index address is never selected and hence effectively bypassed. The present invention may be utilized after traditional redundancy testing has or has not been performed.

The present invention may be used in a variety of cache applications which use set-associative cache memories and is especially advantageous when used to render large cache memories usable rather than discarding them; the present invention allows large cache memories to be used since yield limitations are reduced. Also, valuable devices such as microprocessors and ASICs which utilize embedded set associative cache memory may be salvaged. The present invention may be used to render embedded memory having defects such as single bits, locked rows, locked columns, particle contamination, and the like, usable.

If a LRU replacement algorithm is used, for example, then the least recently used line of data of the set-associative cache is chosen to be replaced, and all the status bits for the requested index address are updated to reflect the new LRU status for the associated tags. A two-way set associative cache, for example, would require only a one bit replacement status bit per tag since there are only two sets in which data is stored; similarly, for a four-way set associative cache memory two replacement status bits are required per tag since there are four sets in which data is stored. Thus, a first logic level, for instance a logic low level, on the replacement status bit would indicate that a line of data is the LRU line of data, while a second logic level, such as a logic high level, on the replacement status bit would indicate that the line of data is a more recently used line of data contained in the tag for that index address. A more recently used line of data may or may not be the most recently used (MRU) line of data. For instance, in a two-way set associative cache the more recently used line of data is the MRU line of data, whereas in a larger set associative cache memory such as a four-way set associative cache, a more recently used line of data need not be the MRU line of data. Thus, the replacement status bit of a replacement line of data from main memory would be set to a high logic level, and the replacement status bit of the remaining line of data in the other set which was not replaced would be reset to a low logic level since it is now the LRU line of data for the index address.

Figure 2:
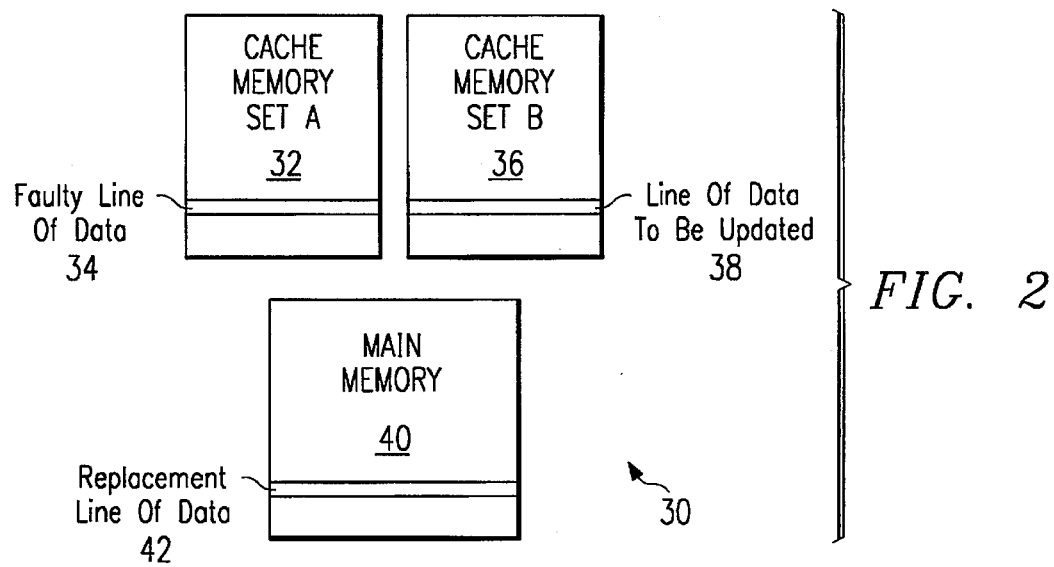
FIG. 2 is a block diagram illustrating a faulty line of data, a line of data to be updated, and a replacement line of data.

Referring to the two-way set associative cache memory 30 of FIG. 2, suppose for a given index address that cache memory set A 32 of a two-way set associative cache memory contains a faulty line of data 34 containing one or more faulty bits of data. To ensure that the faulty line of data 34 or its associated tag is always bypassed and never updated following a cache miss, the replacement status bit of the index address associated with the faulty line of data 34 of set A 32 is always forced to a logic high level, and the replacement status bit associated with line of data 38 of cache memory set B 36 is always forced to a logic low level, for this two-way set associative cache memory LRU example. Thus, following a cache miss condition, a replacement line of data 42 from main memory 40 would always replace the line of data 38 of cache memory set B 36 and would never update the faulty line of data 34 of cache memory set A 32 which is effectively bypassed. The faulty line of data 34 is identified by programming means which are communicated to replacement logic circuitry. The programming means may be accomplished using a variety of fuse programming or storage in registers techniques well known in the art. For instance, registers may be loaded using a Built-In Self Test (BIST) circuit. Additionally, nonvolatile programming means such as electrically programmable read only memories (EPROMs), electrically erasable programmable read only memories (EEPROMs), Flash EPROMs, etc. may be used.

Figure 3:
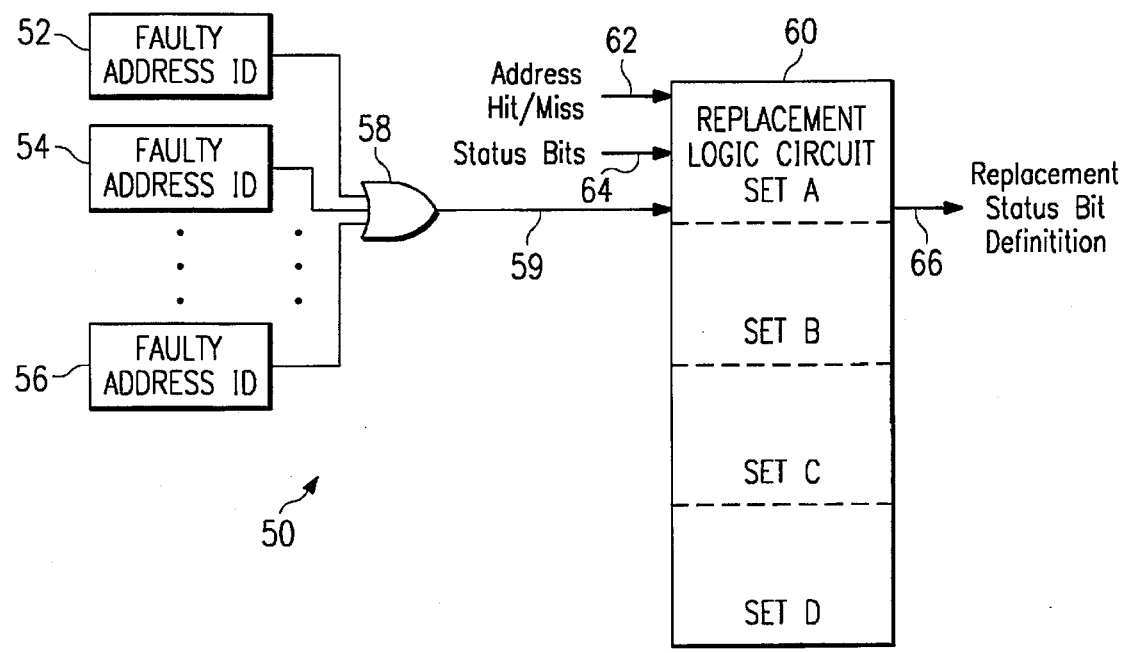
FIG. 3 is a schematic of replacement logic circuitry of a set-associative cache memory, according to the present invention.

Referring to FIG. 3, circuitry 50 having replacement logic circuit 60, according to the present invention, is shown. Replacement logic circuit 60 has been divided into four segments, marked by dashed lines as shown, to represent set A, set B, set C, and set D of a four-way set associative cache memory. The input signals 59, 62, and 64 shown are for set A only and thus the circuitry 52–58, input signals 62, 64, and output signal 66 would be duplicated for each set. Replacement logic circuit 60 will perform logic on four signals analogous to signals 59, 62, and 64 in order to produce signal 66.

A plurality of faulty addresses of a faulty line of data are identified using faulty address identification blocks 52, 54, and 56, which, as mentioned, may contain fuse circuitry or register circuitry well known in the art. The output signals of faulty address identification blocks 52, 54, and 56 are input signals to logic circuitry, such as logic OR gate 58, which produces signal 59. Signal 59, address hit/miss signal 62, and status bit(s) signal 64 are all input signals to replacement logic circuit 60 as shown and these signals are associated with a particular set, set A. Address hit/miss signal 62 indicates whether there is a cache hit or a cache miss condition for set A, and status bits signal 64 provides status information concerning set A including the logic level of a replacement status bit of set A to replacement logic circuit 60. Replacement logic circuit 60 performs logic on signals 59, 62, and 64 to produce signal 66 which determines the replacement status bit definition.

The example described above illustrates how replacement logic circuit 60 may be used in conjunction with a first preferred embodiment which uses a LRU replacement algorithm. Replacement logic circuit 60 may also be used in conjunction with a second preferred embodiment which also uses a LRU replacement algorithm, as an example. A set containing a faulty line of data would not be bypassed by forcing its replacement status bit to a predetermined logic level. Rather, when the faulty line of data becomes the LRU line of data, it is not updated based on the programming means discussed earlier. The programming means define the faulty line of data as faulty so that it is not updated. Instead, the line of data to be updated next, for instance the LRU +1 line of data, will be immediately updated.

The above process of bypassing faulty lines of data renders an effectively smaller set associative cache memory by the number of faulty data locations that are bypassed. Random faulty bits are not likely to be numerous after redundancy testing has been exhausted. For example, if a four-way set associative cache memory is used, and one data location contains faulty data, then for the index address associated with the faulty data, the cache will function as a three-way set associative cache memory since there are only three rather than four sets from which to obtain data. However, any resulting performance degradation may be imperceptible since there will typically be only a relatively small percentage of available addresses which are bypassed.

Additionally, use of the present invention will not slow down the set associative cache memory since the speed path of the replacement logic is not impaired. In the case of a four-way set associative cache memory having faulty data in one of the four sets, the replacement logic circuitry will detect the states of each of the four replacement status bits associated with each of the four sets. The replacement status bit for any faulty line of data will cause the faulty line of data to not be updated following a cache miss condition. Upon a cache miss, a new line of data is brought into the cache from main memory. An existing line of data must be replaced by the incoming replacement line, assuming the cache is full. The choice of which line of data to replace is based on the state of the replacement status bits in the tag of the index address associated with each line of data stored in the cache. Thus, the faulty location is fixed such that it is not chosen for replacement.

While the invention has been particularly shown and described with reference to a preferred embodiment, it will be understood by those skilled in the art that various changes in form and detail may be made therein without departing from the spirit and scope of the invention. For instance, the two-way set associative cache LRU example described herein is but one embodiment of the present invention. The present invention is equally well suited for use with other replacement algorithms previously mentioned, such as the FIFO replacement algorithm, the LIFO replacement algorithm, the random replacement algorithm, and the pseudo LRU replacement algorithm.

What is claimed is:

1. A method of bypassing a faulty line of data or its associated tag of a set associated cache memory, comprising the steps of:

identifying an address of a faulty line of data associated with a first set of a set associative cache memory;

generating a faulty line of data address signal corresponding to the address of the faulty line of data;

performing logic on the faulty line of data address signal, an address hit/miss signal, and a status bit signal to produce a logic state of a replacement status bit of the faulty line of data that flags the address of the faulty line of data, wherein the address hit/miss signal indicates whether there is a cache hit or a cache miss condition for the first set associative cache memory;

flagging the address of the faulty line of data using a replacement logic circuit so that when a replacement line of data having an address corresponding to the address of the faulty line of data, is to be written to the set associative cache memory, the replacement line of data is written to a second set of the set associative cache memory, as determined by the replacement logic circuit, effectively bypassing the faulty line of data of the first set.

2. The method of claim 1, wherein the set associative cache memory has a plurality of lines of data contained in a plurality of sets and each line of data has an address and at least one replacement status bit associated with it which indicates when each line of data was used relative to other lines of data of different sets corresponding to the same address.

3. The method of claim 2, wherein the replacement logic circuit uses a least recently used (LRU) replacement algorithm to update a least recently used (LRU) line of data with the replacement line of data.

4. The method of claim 3, wherein the replacement status bit of the faulty line of data is forced to a first logic level which denotes the faulty line of data as a more recently used line of data which is not updated by the replacement line of data; rather a line of data of the second set whose replacement status bit is equal to a second logic level which denotes the line of data as the least recently used (LRU) line of data is updated by the replacement line of data.

5. The method of claim 3, wherein when the replacement status bit of a line of data denotes the line of data as the least recently used (LRU) line of data, the line of data is updated with the replacement line of data; however, when the faulty line of data is the LRU line of data, the faulty line of data is bypassed and another line of data is updated with the replacement line of data as determined by the replacement logic circuit.

6. The method of claim 1, wherein a programming means is used to identify the address of the faulty line of data.

7. The method of claim 6, wherein the programming means uses fuse programming.

8. The method of claim 6, wherein the programming means uses a plurality of registers.

9. The method of claim 8, wherein the registers are loaded using a built-in self test (BIST) circuit.

10. The method of claim 6, wherein the programming means uses nonvolatile devices.

11. The method of claim 1, wherein the replacement logic circuit uses a first in first out (FIFO) replacement algorithm.

12. The method of claim 1, wherein the replacement logic circuit uses a last in first out (LIFO) replacement algorithm.

13. The method of claim 1, wherein the replacement logic circuit uses a random replacement algorithm.

14. The method of claim 1, wherein the replacement logic circuit uses a pseudo least recently used (LRU) replacement algorithm.

15. The method of claim 1, wherein the set associative cache memory is an embedded cache memory.

16. The method of claim 15, wherein the embedded cache memory is a primary cache of a microprocessor.

17. A structure for bypassing a faulty line of data or its associated tag of a set associative cache memory, comprising:

a set associative cache memory having a plurality of lines of data contained in a plurality of sets with each line of data having at least one replacement status bit associated with it which indicates when each line of data was used relative to other lines of data of different sets corresponding to an address;

a faulty address identification block which identifies an address of a faulty line of data of the plurality of lines of data of a set of the plurality of sets;

a logic element having the address of the faulty line of data as an input signal which generates a faulty line of data address signal corresponding to the address of the faulty line of data;

a replacement logic circuit which performs logic on the faulty line of data address signal, an address hit/miss signal, and a status bit signal to produce a logic state of a replacement status bit of the faulty line of data that flags the address of the faulty line of data such that when an address of a faulty line of data is detected during a replacement cycle following a cache miss condition the faulty line of data is bypassed, wherein the address hit/miss signal indicates whether there is a cache hit or a cache miss condition for the first set of the set associative cache memory.

18. The structure of claim 17, wherein the replacement logic circuit uses a least recently used (LRU) replacement algorithm to update a least recently used (LRU) line of data with a replacement line of data.

19. The structure of claim 18, wherein the replacement status bit of the faulty line of data is forced to a first logic level which denotes the faulty line of data as a more recently used line of data which is not updated by the replacement line of data; rather a line of data whose replacement status bit is equal to a second logic level which denotes the line of data as the least recently used (LRU) line of data is updated by the replacement line of data.

20. The structure of claim 18, wherein when the replacement status bit of a line of data denotes the line of data as the least recently used (LRU) line of data, the line of data is updated with the replacement line of data; however, when the faulty line of data is the LRU line of data, the faulty line of data is bypassed and another line of data is updated with the replacement line of data as determined by the replacement logic circuit.

21. The structure of claim 17, wherein a programming means is used to identify the address of the faulty line of data.

22. The structure of claim 21, wherein the programming means uses fuse programming.

23. The structure of claim 21, wherein the programming means uses a plurality of registers.

24. The structure of claim 23, wherein the registers are loaded using a built-in self test (BIST) circuit.

25. The structure of claim 21, wherein the programming means uses nonvolatile devices.

26. The structure of claim 17, wherein the replacement logic circuit uses a first in first out (FIFO) replacement algorithm.

27. The structure of claim 17, wherein the replacement logic circuit uses a last in first out (LIFO) replacement algorithm.

28. The structure of claim 17, wherein the replacement logic circuit uses a random replacement algorithm.

29. The structure of claim 17, wherein the replacement logic circuit uses a pseudo least recently used (LRU) replacement algorithm.

30. The structure of claim 17, wherein the set associative cache memory is an embedded cache memory.

31. The structure of claim 30, wherein the embedded cache memory is a primary cache of a microprocessor.

* * * * *